United States Patent
Tsao et al.

(10) Patent No.: US 6,556,508 B2
(45) Date of Patent: Apr. 29, 2003

(54) INTEGRATED CIRCUIT MEMORY DEVICE HAVING INTERLEAVED READ AND PROGRAM CAPABILITIES AND METHODS OF OPERATING SAME

(75) Inventors: Cheng-Chung Tsao, Hsinchu (TW); Tien-ler Lin, Saratoga, CA (US)

(73) Assignee: Integrated Memory Technologies, Inc., Santa Clara, CA (US)

(*) Notice: Subject to any disclaimer, the term of this patent is extended or adjusted under 35 U.S.C. 154(b) by 0 days.

(21) Appl. No.: 10/206,474

(22) Filed: Jul. 25, 2002

(65) Prior Publication Data

US 2003/0031053 A1 Feb. 13, 2003

Related U.S. Application Data

(62) Division of application No. 09/718,649, filed on Nov. 21, 2000, now Pat. No. 6,469,955.

(51) Int. Cl.[7] .............................................. G11C 8/00
(52) U.S. Cl. ........................ 365/238.5; 365/230.08; 365/189.01; 365/189.05
(58) Field of Search .................. 365/238.5, 230.08, 365/189.01, 189.05

(56) References Cited

U.S. PATENT DOCUMENTS

| | | | | |
|---|---|---|---|---|
| 5,740,122 A | * | 4/1998 | Toda et al. | 365/233 |
| 5,768,215 A | * | 6/1998 | Kwon et al. | 365/238.5 |
| 5,844,858 A | * | 12/1998 | Kyung | 365/233 |
| 6,249,481 B1 | * | 6/2001 | Toda et al. | 365/233 |
| 6,377,507 B1 | * | 4/2002 | Tsao | 365/230.03 |

* cited by examiner

Primary Examiner—Richard Elms
Assistant Examiner—Tuan T. Nguyen
(74) Attorney, Agent, or Firm—Gray Cary Ware & Freidenrich LLP

(57) ABSTRACT

A nonvolatile semiconductor memory includes a plurality of memory cells arranged in columns and rows, a plurality of word lines, a plurality of bit lines, a plurality of output buffers, and a plurality of page buffers grouped in a plurality of sub-pages. Each page buffer is connected to corresponding bit lines through a first column decoder circuit and connected to one corresponding output buffer through a second column decoder circuit. This construction allows the peripheral control circuits to clock out data stored in page buffers of a first sub-page into output buffers while latching bit line data into page buffers of a second sub-page. Therefore, this architecture is able to perform read and update the page buffer data of different sub-pages simultaneously. Two sets of address registers are used to store the starting and the end address for programming. During programming, only sub-pages located between the starting and end address will be programmed successively. This sub-page programming technique greatly reduces the disturbance and programming time.

13 Claims, 16 Drawing Sheets

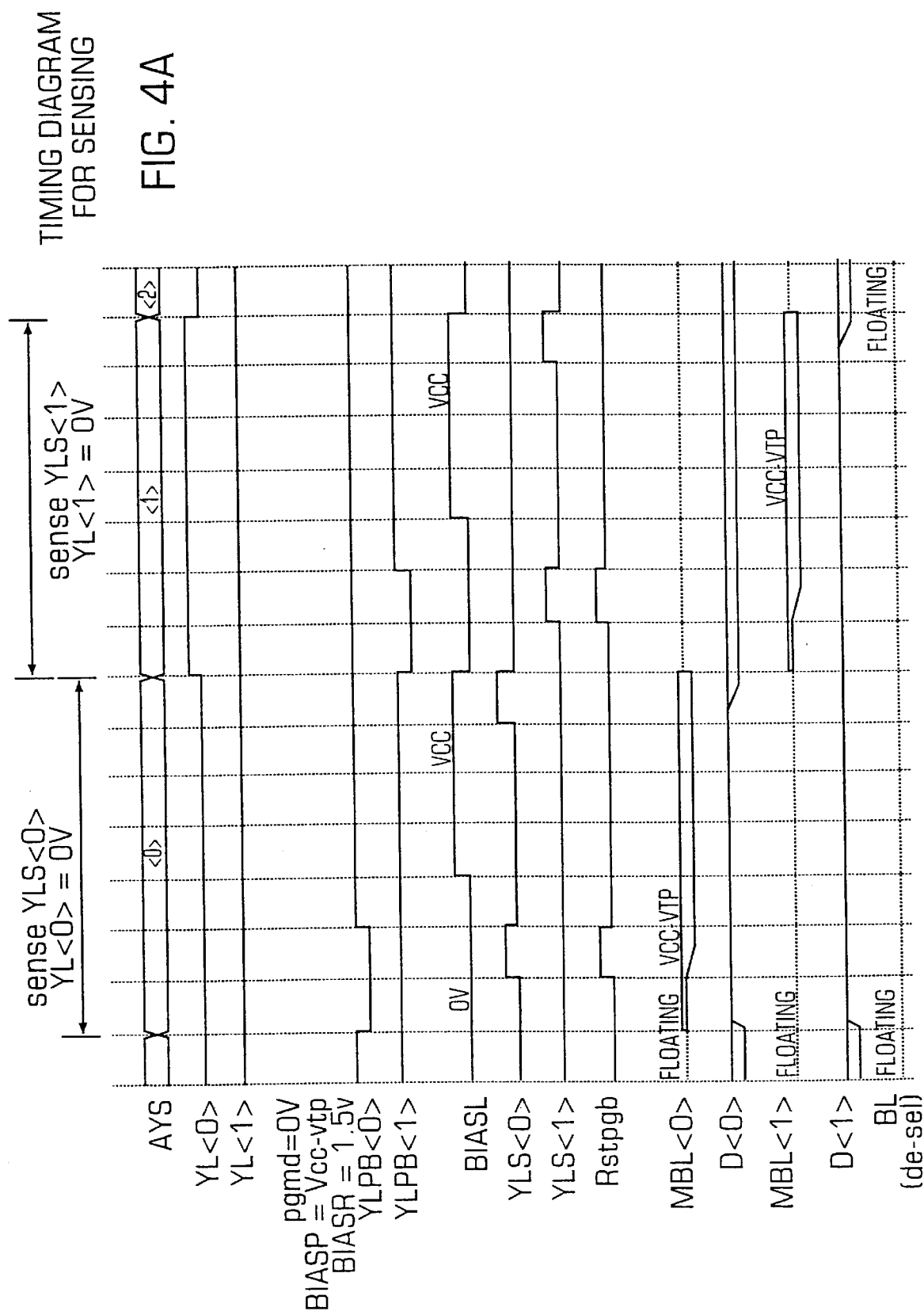
FIG. 4A TIMING DIAGRAM FOR SENSING

INTEGRATED CIRCUIT MEMORY DEVICE HAVING INTERLEAVED READ AND PROGRAM CAPABILITIES AND METHODS OF OPERATING SAME

CROSS REFERENCE TO RELATED APPLICATIONS

This application is a divisional of and claims the benefit of U.S. application Ser. No. 09/718,649 filed Nov. 21, 2000, now U.S. Pat. No. 6,469,955, issued on Oct. 22, 2002, the disclosure of which is incorporated herein by reference.

BACKGROUND OF THE INVENTION

1. Field of the Invention

The present invention relates to an improved integrated memory circuit, with the capability of reading or programming continuously, pages of data, without any gaps, and to methods of operating same.

2. Description of the Prior Art

Semiconductor integrated memory circuit devices for storing data typically have been categorized as either volatile, in which the data is lost once the power is turned off, or non-volatile, in which the data is retained even after the power is turned off.

Non-volatile memories, comprising an array of non-volatile memory cells arranged in a plurality of rows and columns (or bit lines), can be categorized as either NAND or NOR type, referring to the manner in which the non-volatile memory cells are arranged in the array. Further, the non-volatile memory cells can be arranged to operate in a page mode manner, in which a page of data (typically 512 bytes) is stored in a plurality of latches (or plurality of page buffers) that are integrated with the memory circuit device. Reading of the integrated memory circuit device causes data from a page of the memory cells to be read and stored in the plurality of latches. Thereafter the contents of the plurality of latches are read, typically, in a serial manner, from the integrated memory circuit device. Programming of the integrated memory circuit device causes data from the external to be stored in the plurality of latches. Thereafter, the contents of the plurality of latches are stored in a page of non-volatile memory cells. Typically a page of non-volatile memory cells lie in the same row or word line.

In a conventional page-mode read operation, whenever a word line is addressed, a wait state is necessary for the on-chip control circuits to sense out data stored in the memory cells of that selected word line. After being sensed out, the data is latched into the plurality of page buffers before they are clocked out to the I/O pads. This wait-state, typically around several micro-seconds, accounts for a significant portion of the average page-mode read access time. Especially in applications of reading large volume data, several consecutive word lines are often addressed successively. With one wait-state for each addressed word line, the overall read performance is deteriorated. Therefore, a non-volatile memory with minimized number of wait-states is needed to provide high performance page-mode read operation.

In U.S. Pat. No. 5,768,215 a proposed solution to the aforementioned problem of the wait state is to provide two groups of page buffers, with each group of page buffers being one half the size of a page of memory cells. Initially, the data from a first page of memory cells is read into the two groups of page buffers. Thereafter, a first group of page buffers is read and the contents outputted to the external. However, as soon as the reading of the contents of the second group of page buffers commences, the reading of a second page of memory cells commences with the data read from one half of the second page of memory cells being stored in the first group of page buffers. After the contents of the second group of page buffers is outputted to the external, one half of the second page of memory cells will also have been read and stored in the first group of page buffers. As the reading of the first group of page buffers commences, the reading of the second half of the second page of memory cells commences and is stored in the second group of page buffers. This alternation of reading one half of a page of memory cells and storing the data into one of the groups of page buffers, while the contents of the other group of page buffers is read out continues.

In a conventional page-mode program operation, data is first loaded into the plurality of page buffers sequentially. Regardless of the number of bits (or collective bytes) to be programmed, all the data loaded into the plurality of page buffers will be programmed into the memory cells of a selected page simultaneously. Since the on-chip circuits, such as the charge pump (because typically programming requires a voltage source higher than the externally supplied voltage) can deliver only a limited amount of current, the efficiency of programming will deteriorate as the number of bits increases. Because of the limitation in the amount of current that can be provided by the on-board charge pump, one solution is to require a larger amount of time to program a page (or more) of data. Therefore a new technique is needed to provide high efficiency programming.

Finally, non-volatile memory cells used in NAND architecture are typically of the stack gate type, such as that disclosed in U.S. Pat. No. 5,768,215. Further, the non-volatile memory cells used in NOR architecture can be both the stack gate type or the split gate type such as that disclosed in U.S. Pat. No. 5,668,757, whose disclosure is incorporated by reference in its entirety.

SUMMARY OF THE INVENTION

In the present invention, an integrated circuit memory device has a page of memory cells arranged in a plurality of sub-pages of memory cells. The memory cells are electrically coupled to a plurality of word lines, and a plurality of bit lines. A plurality of sub-page buffers are electrically coupled to the plurality of bit lines for storing data read from the memory cells coupled to the plurality of bit lines. The device further has an I/O data buffer. Each sub-page comprises a plurality of non-adjacent bit lines with memory cells coupled thereto, with the bit lines of each of the sub-page interleaving bit lines of another sub-page. A read controller circuit is coupled to the plurality of sub-page buffers for initiating a read operation to read data from a first sub-page of memory cells to an associated first sub-page buffer, while simultaneously reading data from a second sub-page buffer to said I/O data buffer.

The present invention also relates to an integrated circuit memory device having a NOR architecture emulating the read and programming operations of a NAND integrated circuit memory device. Finally, the present invention relates to a read-modify-write circuit.

BRIEF DESCRIPTION OF THE DRAWINGS

FIG. 4A is a timing diagram for page-mode read operation for the device of the present invention.

DETAILED DESCRIPTION OF THE PREFERRED EMBODIMENT

Figure 1:
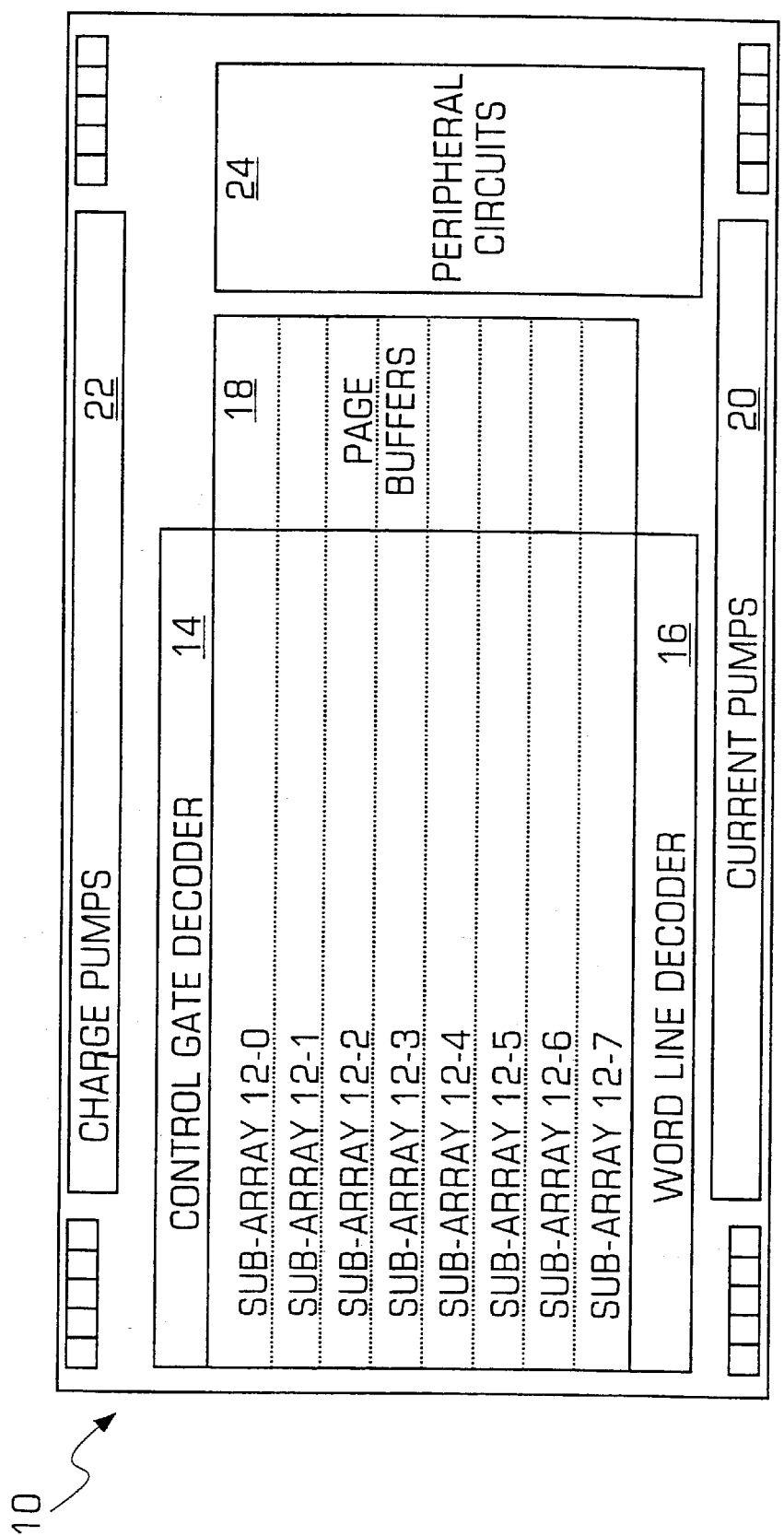
FIG. 1 is a schematic layout of a floor plan of an integrated memory circuit device of the present invention.

Referring to FIG. 1 there is shown a schematic layout of a floor plan for an integrated memory circuit device 10 of the present invention. As is well known, the device 10 is fabricated from silicon and is an integrated circuit device or a chip 10. In the preferred embodiment, the device or chip 10 is an 8M×8-bit flash EEPROM, using non-volatile memory cells of the split gate type arranged in a NOR array 12 as disclosed in U.S. Pat. No. 5,668,757, which disclosure is incorporated by reference. As disclosed in U.S. Pat. No. 5,668,757 programming of the memory cell occurs by hot channel electron tunneling. Further, in the preferred embodiment, although the device 10 has its non-volatile memory cells arranged in a NOR array 12, the device 10 emulates the operation of a NAND type page mode device. However, it should be noted that the present invention is not limited to this specific density or configuration or mode of operation.

The memory cell array 12 is located in the center of the device 10. On the left side of the array 12, a control gate decoder 14 is located. On the right side of the array 12, a word-line decoder 16 is located. A plurality of page buffers 18 are placed on the upper side of the array 12. In the preferred embodiment, there are 512×8 page buffers that correspond to a page of 1024×8 memory cells. Peripheral circuits 24 are located on the upper side of the device 10. On the left side of the device 10, charge pumps 22 are placed. On the right side of the device 10, the current pumps 20 are placed. In the vicinity of corners of the device 10, pads (such as I/O, power and control) are placed.

Since the memory cell array is configured as 8M×8-bit, the entire memory cell array 12 is divided into 8 identical sub-arrays (sub-array 12-0, sub-array 12-1, . . . sub-array 12-7). Each sub-array has a corresponding I/O. Thus, sub-array 12-0 corresponds to I/O-0 . . . sub-array 12-7 corresponds to I/O-7. Although the memory cell array 12 is divided into 8 identical sub-arrays 12-n, each word line from the word line decoder 16, and each control gate line from the control gate decoder 14 runs "horizontally" across all eight identical sub-arrays 12-n. In the preferred embodiment, a word line and a control line crosses 1024×8 cells, with each cell each having an associated bit line. Thus, there are 1024 cells in each sub-array 12-n. Within each sub-array 12-n, there are 512 page buffers 18. Thus, there are two memory cells associated with each page buffer 18. To simplify the illustration, only one of the 8 sub-arrays 12-n and its corresponding page buffers 18-n are described and shown in the following drawings.

Figure 2A:
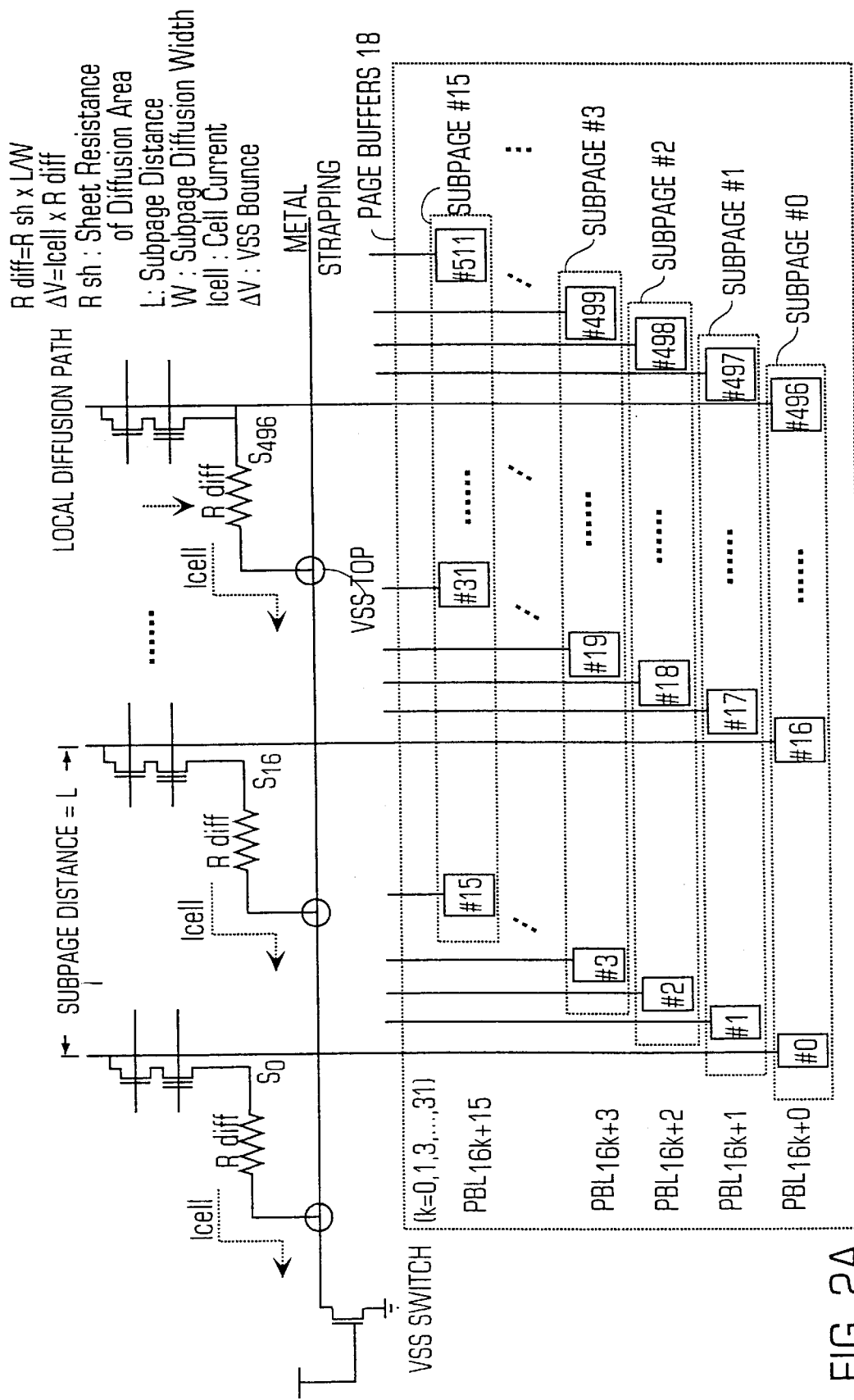
FIG. 2A is a schematic diagram showing the connection of the bit lines to page buffers and the grouping of page buffers into sub-pages in the device of the present invention.

Referring to FIG. 2A, a plurality of adjacent signal lines PBL0 to PBL511 are connected to page buffers 18. Each signal line PBL is connected to one page buffer 18. Therefore, there are 512 page buffers 18. Each signal line PBL is further connected to a pair of immediately adjacent bit lines BLj and BL(j+1) through bit line switches 44 (see FIG. 3). Thus, the 512 PBL lines connected the 512 page buffers to 1024 bit lines. Each bit line is in turn connected to a column of non-volatile memory cells. When a particular row of memory cells is selected there are 1024 memory cells associated with the 512 PBL lines. All the 512 (from #0 to #511) page buffers 18 that are connected to the signal lines PBL0–PBL511 are further grouped into 16 interleaved sub-pages 18-n. Thus, each sub-page 18-n comprises 32 page buffers 18. The grouping of each sub-page 18-n and its members are as follows:

Sub-page n comprises PBL [16k+n] where n=0,1, . . . , 15; k=0,1, . . . ,31;

Thus, Sub-page 18-0 comprises page buffers 18 connected to PBL [0], [16], [32], [48], . . . ,[496]

Sub-page 18-1 comprises page buffers 18 connected to PBL [1], [17], [33], [49], . . . ,[497]

Sub-page 18-2 comprises page buffers 18 connected to PBL [2], [18], [34], [50], . . . ,[498]

. . .

. . .

Finally, sub-page 18-15 comprises page buffers 18 connected to PBL [15], [31], [47], [63], . . . ,[511]

As can be seen from the foregoing, each sub-page 18-n comprises page buffers 18 that are not located immediately adjacent to one another. Instead, page buffers 18 of the same sub-page 18-n are connected to signal lines PBL that are spaced equal distance apart (namely by the size of 15 page buffers 18) from one another and are grouped together to form a sub-page. Thus, the 16 sub-pages 18-0–18-15 are interleaved with one another. With this arrangement, the current drawn by selected memory cells during a sub-page pre-fetch can be spread out evenly across the whole memory cell sub-array 12-n rather than being crowded over an area as narrow as the pitch of 32 adjacent PBL signal lines. The distance between two adjacent PBLs is carefully selected based on the sheet resistance of source diffusion area of memory cells.

Figure 2B:
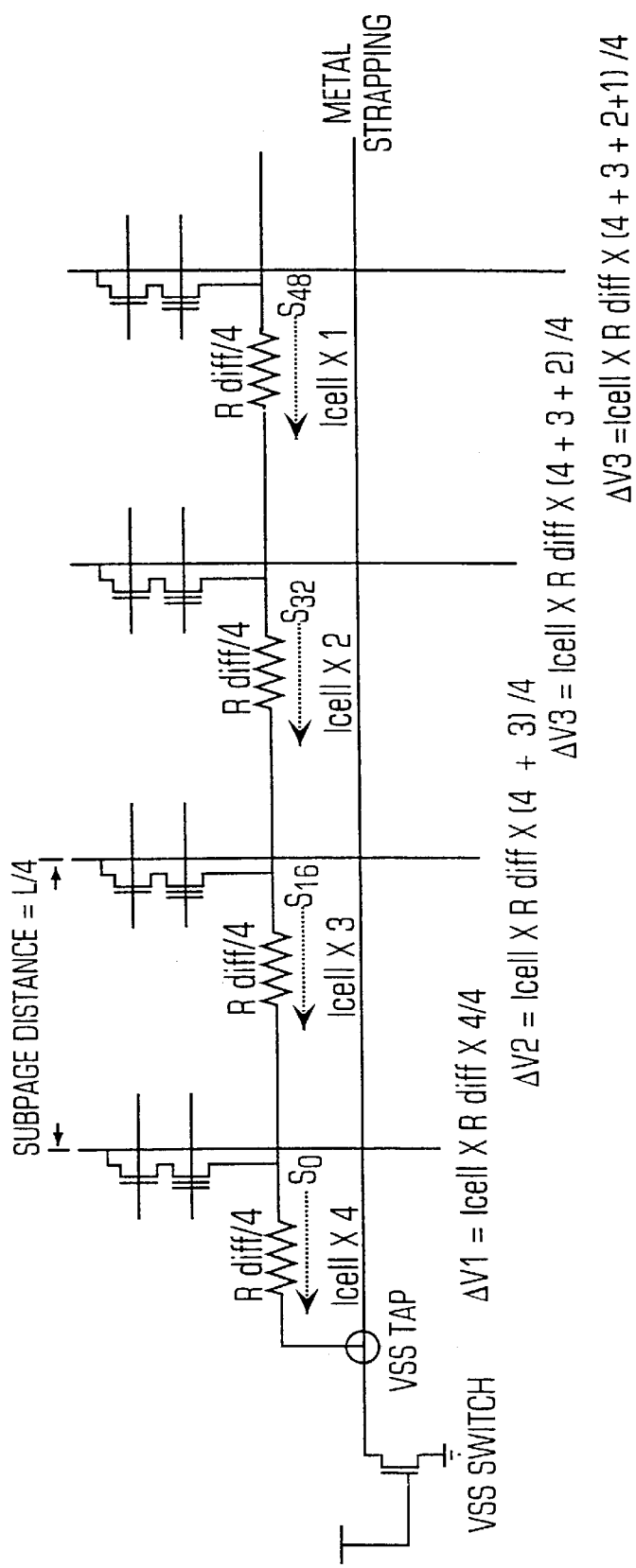
FIG. 2B is a schematic diagram showing the connection of the metal strapping to VSS.

Referring to FIG. 2A, the source line of each memory cell is connected together by a local diffusion path. A metal strapping runs through the cell array horizontally. Periodic VSS taps are made to connect the local diffusion path to VSS. If the sub-page distance L is long enough to accommodate 1 VSS tap for each selected bit line as depicted in the figure, the VSS bounce (or ground bounce) will be minimized down to Icell×Rdiff. Where Icell is the cell current and Rdiff is the diffusion resistance. If the sub-page distance is reduced to L/4, 1 VSS tap is shared among 4 selected bit lines, the VSS bounce increases differently for those 4 bit lines as depicted in FIG. 2B. Therefore, an optimal value of L could be resulted from the trade off between the layout area penalty of VSS taps and the VSS bounce.

Figure 3:
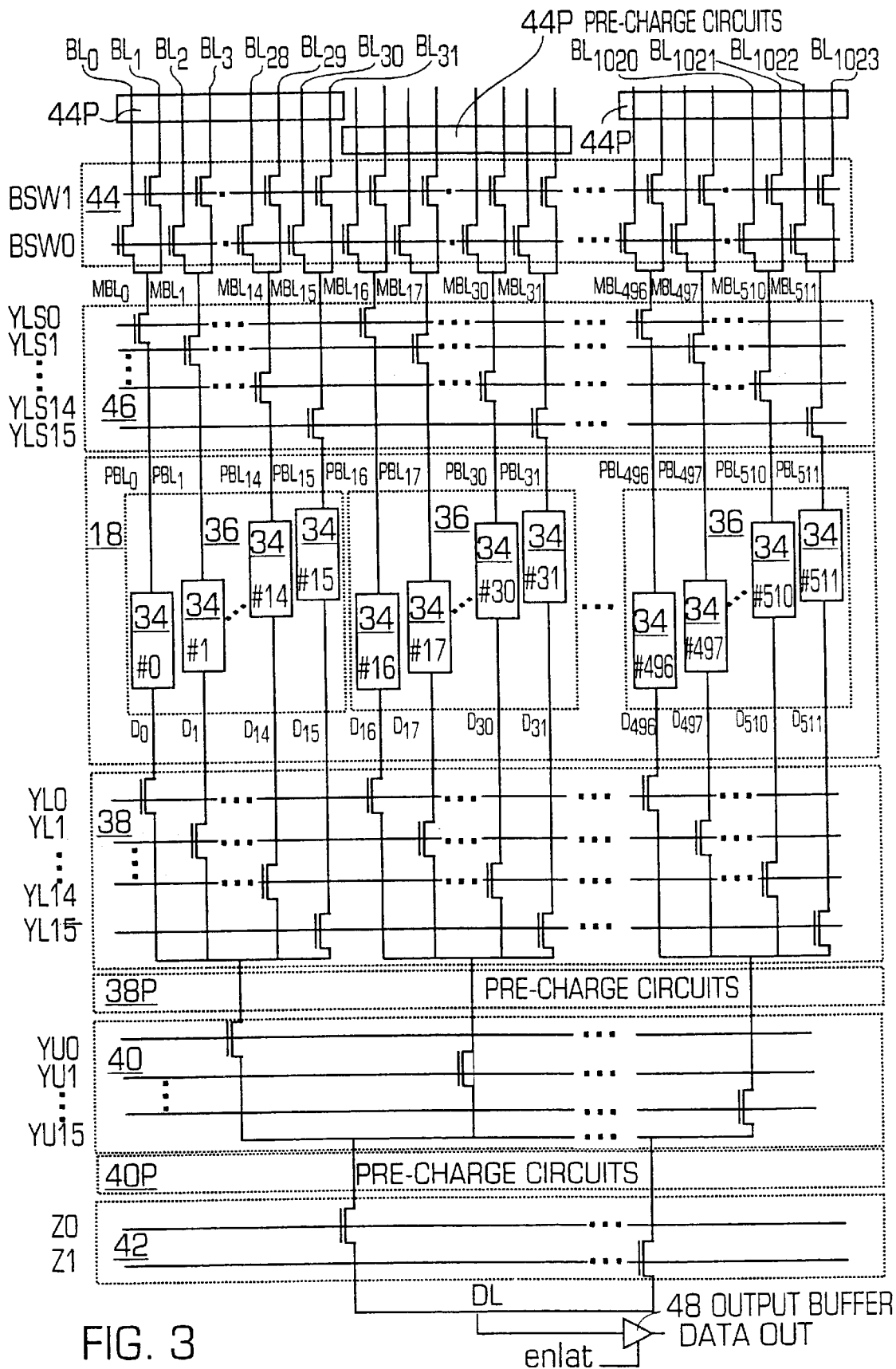
FIG. 3 is a detailed schematic circuit diagram showing the connections between the page buffers and bit-lines, and the connections from page buffers to output buffers of the device of the present invention.

FIG. 3 is a schematic diagram showing the page buffers 18, the first column decoder 46, the second column decoder 38/40/42, the sense amplifier and output buffer 48. In this drawing, the data latches and sensing circuits 34 constitute the page buffers 18. Data latches and sensing circuits 34 are connected to corresponding PBL lines respectively and through the first column decoder 46, the PBL lines are connected to the MBL lines. Each MBL line is connected to a pair of bit-lines through 2 bit-line switches 44 BSW0/BSW1. Each data latch and sensing circuit 34x is also connected to data line Dx (as shown and discussed hereinafter, data line Dx comprises a pair of data lines) through the second column decoder 38/40/42. Dx is connected to sense amplifier and output buffer 48 through the second column decoders 38/40/42.

Figure 3A:
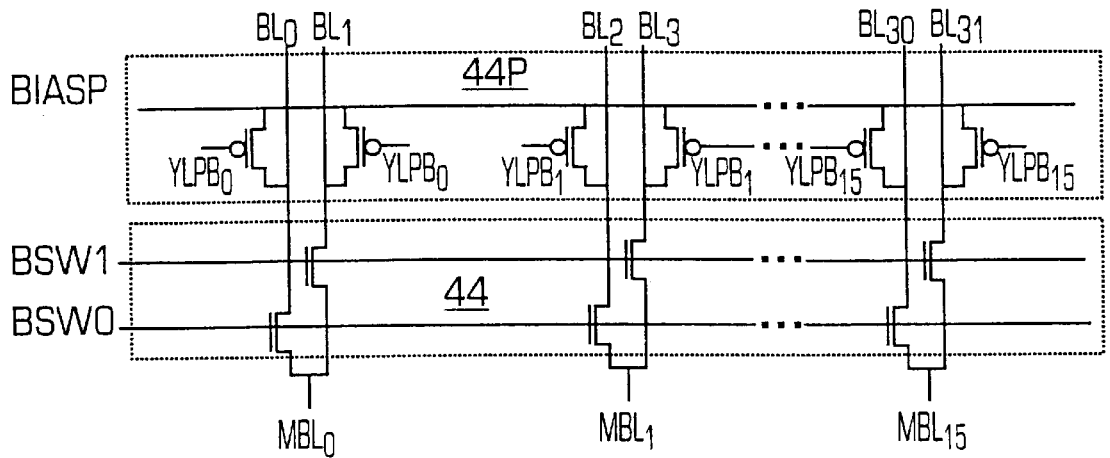
FIG. 3A is a detailed circuit diagram showing the bit-line pre-charge circuits of the device of the present invention.

FIG. 3A is a schematic circuit diagram showing the bit-line pre-charge circuits 44P and the bit-line switches 44. The pre-charge transistors of 44P are used to pre-charge the selected bit-lines to the pre-determined voltage level BIASP before starting the page-mode read operation. The pre-charge transistor is activated by the signal YLPBX, where x=0 . . . 15. The signal YLPBx is a decoded signal which represents the selection of the particular sub-page 18-n. When the particular YLPBX is activated, it activates 32 pairs of bit lines BL, to pre-charge those 64 bit lines. For example, if YLPB0 is activated, then bit lines BL0,1, BL16,17, BL32,33, BL48,49 . . . ,BL496,497 are all connected to the voltage source BIASP.

Figure 3B:
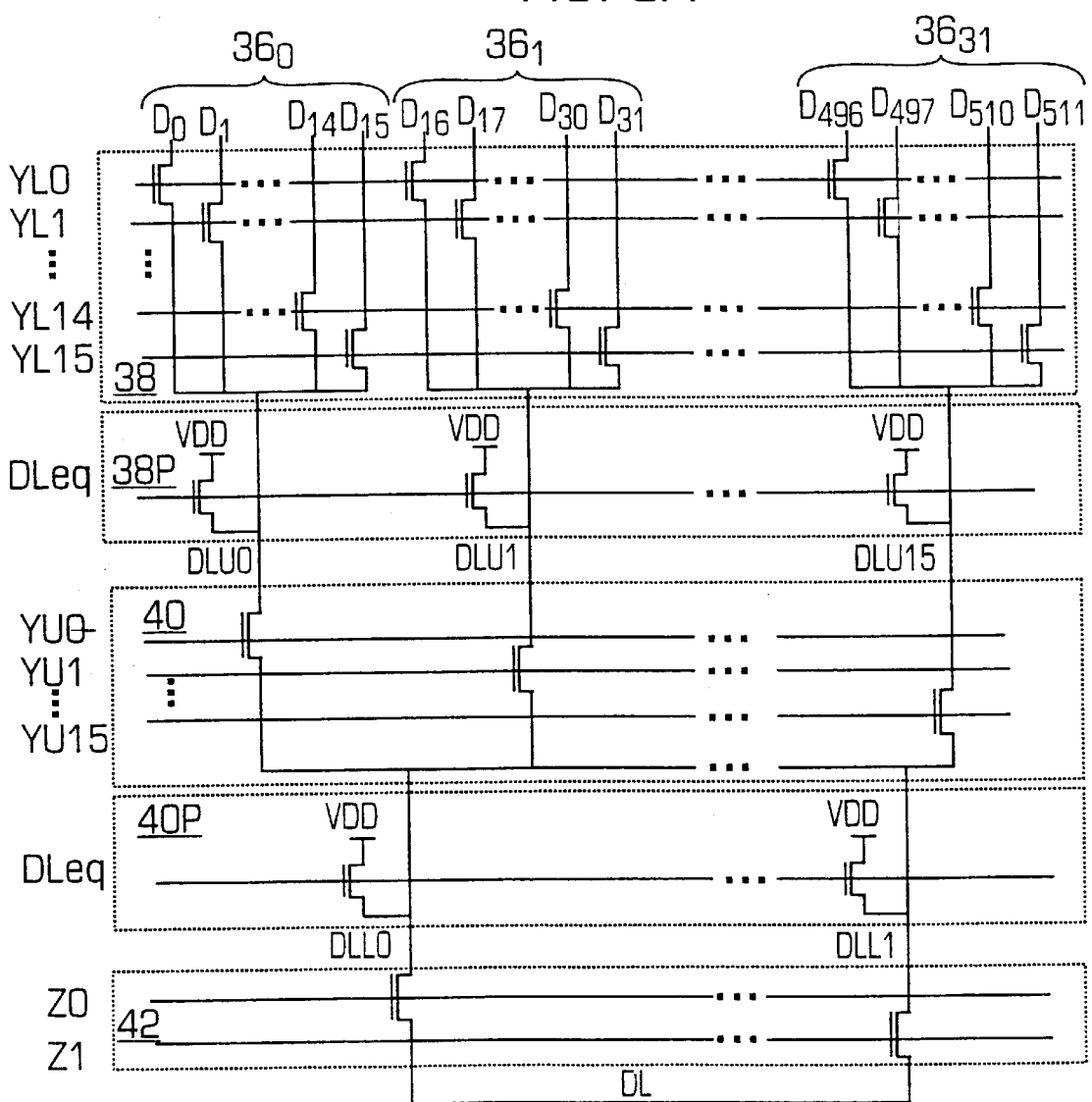
FIG. 3B is a detailed circuit diagram showing the data line pre-charge circuits of the device of the present invention.

Each page buffer 18 is connected to an output line Dx (as discussed previously, in reality the output line Dx is a pair of output lines). Since there are 512 page buffers 18, there are 512 output lines Dx. 16 adjacent page buffers 18 and their associated output lines D(x, x+15) are grouped together to form a group 36. In total there are 32 groups of output lines D. The 32 groups of output lines D are supplied to the second column decoders 38, as shown in FIG. 3B. The second column decoder 38 selects one of the output lines D from each group 36, based upon the select signals YL0 . . . YL15. Thus, the second column decoder 38 selects 32 outputs, one from each group 36, representing all of the outputs of the page buffers 18 from the same selected sub-page 18-n.

The 32 outputs of the second column decoder 38 are supplied to a pre-charge circuit 38P, which outputs the 32 signals at nodes DLU0 . . . DLU15, DLU0 . . . DLU15. (Again, each line represents a pair of output lines.) The pre-charge transistors of the pre-charge circuit 38P are used to pre-charge the intermediate nodes DLUx before switching the second column decoders 38.

From the output of the pre-charge circuit 38P, the signals DLU0 . . . DLU15, DLU0 . . . DLU15 are supplied to the second column decoder 40. The second column decoder 40 selects one of the output lines from the first group of 16 DLU signals, and one of the output lines from the second group of 16 DLU signals, based upon the select signals YU0 . . . YU15. Thus, the second column decoder 40 selects 2 outputs, with each being a pair of lines.

The two outputs from the second column decoder 40 are supplied to a pre-charge circuit 40P, which outputs the 2 signals at nodes DLL0 and DLL1. The pre-charge transistors of the pre-charge circuit 40P are used to pre-charge the intermediate nodes DLLx before switching the second column decoders 40.

From the pre-charge circuit 40P, the signals DLL0 and DLL1 are supplied to the second column decoder 42, which selects one of the signals as the output DL (a pair output lines: DL and DLB), based upon the select signals Z0 and Z1. The selected signal DL (DL and DLB) from the second column decoder 42 is supplied to the output buffer 48.

Thus, through the action of the second column decoders 38/40/42 one signal (both the signal and its complement) stored in a page buffer 18 from a selected sub page 18-n is outputted from the device 10. The pre-charge circuits 38P/40P serve only to pre-charge certain nodes before the second column decoders 38/40/42 are activated. Since all these intermediate nodes DLUx/DLLx are loaded with large parasitic capacitance, any switching on the second column decoders 38/40/42 will cause disturbance to the data latches 34C shown in FIG. 4. To prevent this disturbance, all DLUx/DLLx nodes must be pre-charged to VCC-VTN before switching.

Figure 3C:
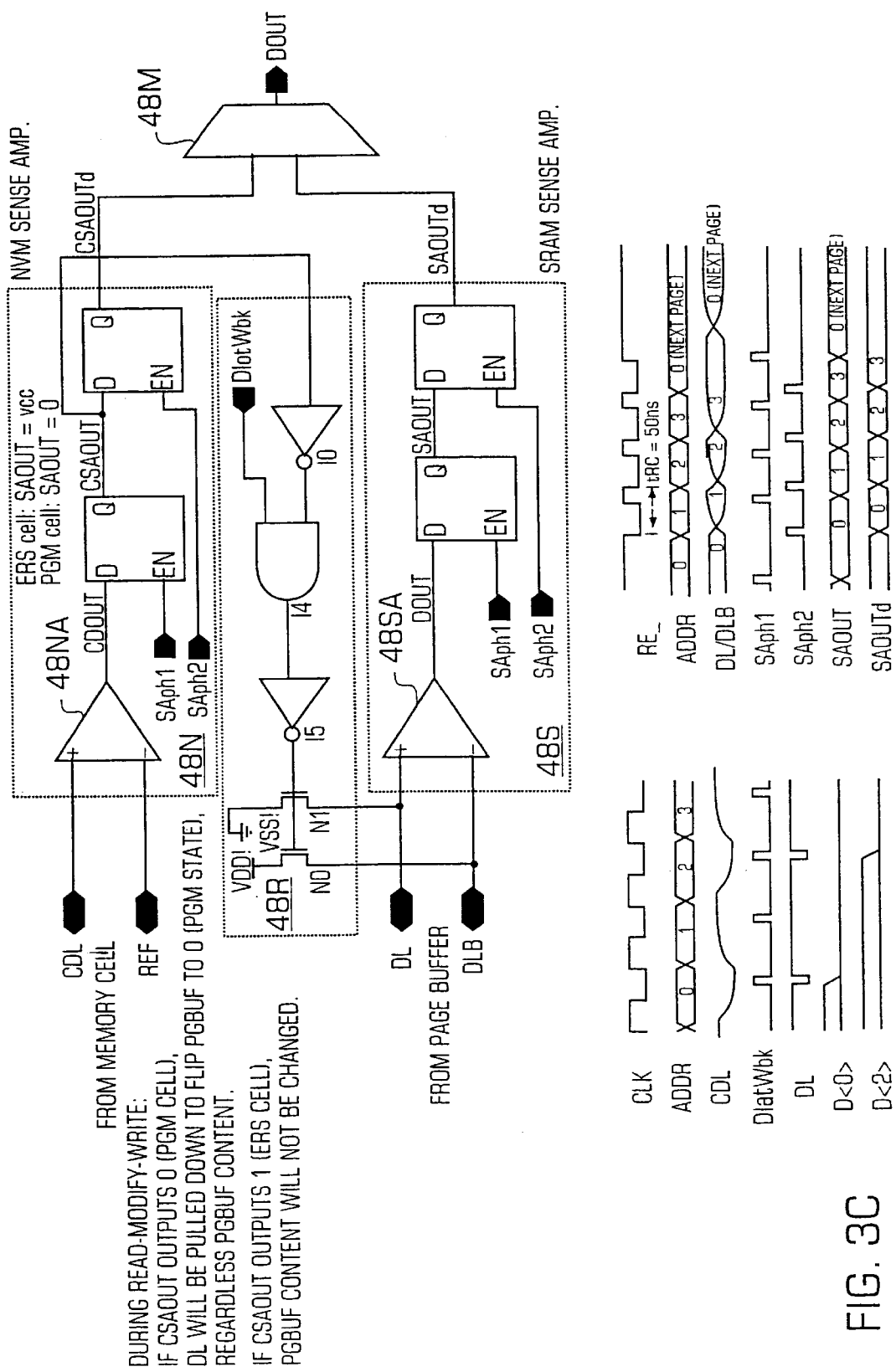
FIG. 3C is a circuit diagram showing a sense amplifier and the read-modify-write circuit associated with each page buffer of the device of the present invention.

FIG. 3C is a schematic circuit diagram showing in detail the output buffer 48. The pair of output signals DL and DLB, representing the data and data inverse signals from the output of a latch from the selected page buffer 18, are supplied to a differential amplifier 48SA. The output, DOUT, of the differential amplifier 48SA, is supplied to a series of latches and is then supplied to a multiplexer 48M. In the page mode of operation, this would be the path of the signal. However, the device 10 can also operate in a non-page mode, wherein the signal from a non-volatile memory cell is read out directly and not stored in the page buffer 18. In that event, the signal from the non-volatile memory cell along with the signal from a reference cell are supplied to a sense amplifier 48NA. The output of the sense amplifier 48NA is supplied to a series of latches and to another input to the multiplexer 48M. The output of the multiplexer 48M is supplied as the output of the device 10.

The latched signal, CSAOUT, from the sense amplifier 48NA, is also supplied in a feedback manner to a feedback circuit 48R, which is connected to the output lines DL and DLB, and is used in a read-modify-write mode during programming operation, which will be discussed greater detail hereinafter.

Figure 4:
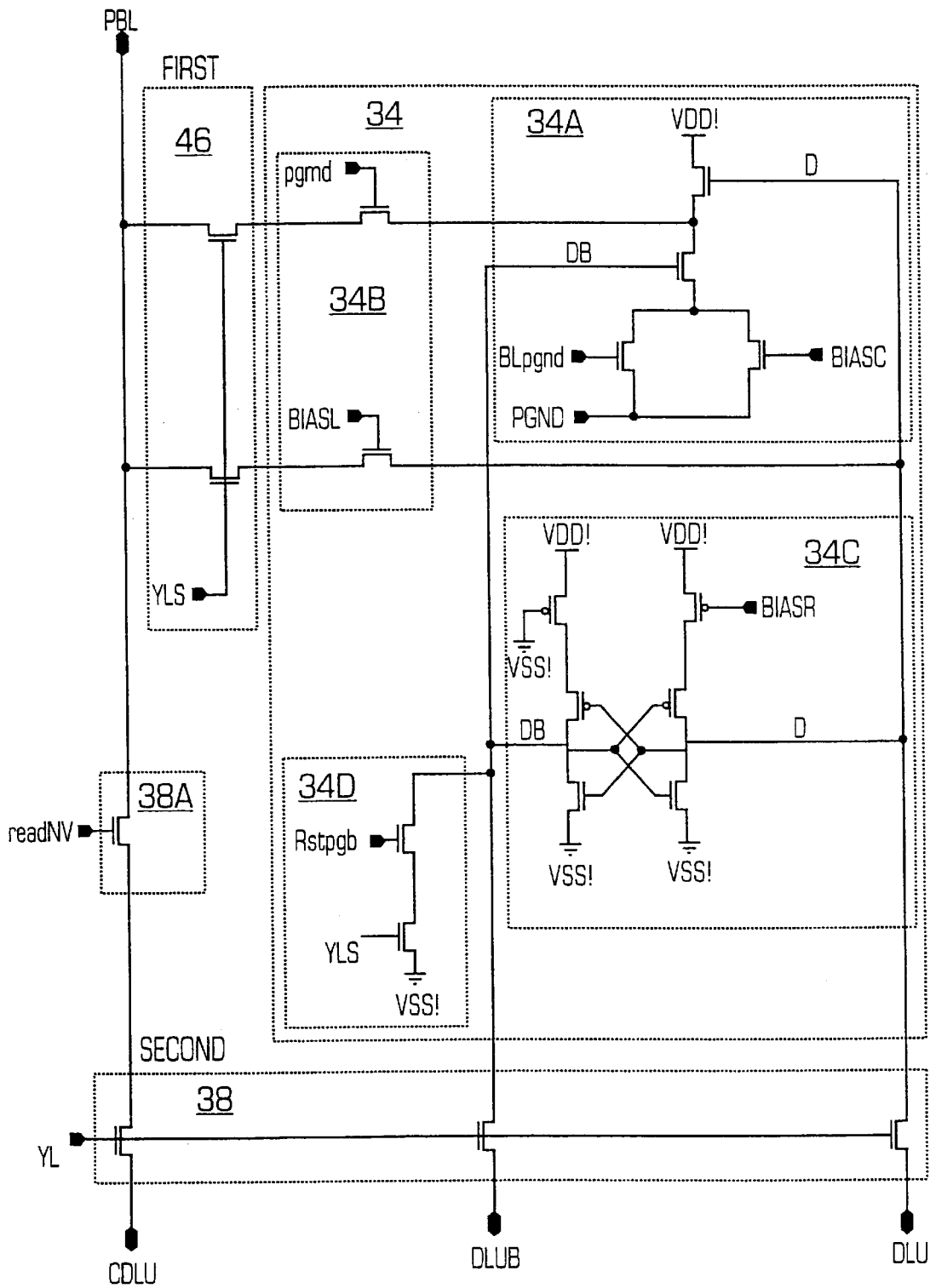
FIG. 4 is a detailed circuit diagram showing the connection of a page buffer to a first and a second column decoder circuits

FIG. 4 is a circuit diagram showing in detail one of the page buffers 18. The second column decoder 38 is shown as comprising 3 transistors I26/I10/I9 for each data latch and sensing circuit 34; however for illustration purposes only, the second column decoder 38 shown in FIG. 3 is shown as comprising only one transistor for each data latch and sensing circuits 34. The first column decoder 46 comprises 2 transistors I24/I42 for each data latch and sensing circuit 34, but again for illustration purpose only, only one transistor is shown in FIG. 3. In this schematic diagram, each data latch and sensing circuit 34 comprises a data latch 34C, a latch reset circuit 34D, a program/sense selection circuit 34B and a program driving circuit 34A. The program/sense operation of this page buffer 18 is described in greater detail below.

To perform the page-mode read operation, the data latch 34C is first reset by the latch reset circuit 34D and the selected bit-line is pre-charged to the voltage level of BIASP by bit-line pre-charge circuits 44P of FIG. 3A. Depending on the data stored in the selected memory cell, PBL (or the bit line or column line) will be driven to either one of the two binary voltage levels: high or low after bit-line pre-charging. The data stored in memory cells can be in one of two states: ON or OFF. Each state represents one of the binary data: 1 or 0. If the selected memory cell is in an ON condition, this cell will draw current to discharge PBL from pre-charged level of BIASP down to 0V (low level). If the selected memory is in an OFF condition, this cell draws no current and PBL stays at the pre-charged level of BIASP (high level). After the pre-charged bit-line reach electrical steady state, the data stored in the selected memory cell is translated into the corresponding voltage level on PBL.

Signal BIASL of the program/sense selection circuit 34B and the selected YLS of the first column decoder 46 turn on the sense path between PBL and the data latch 34C (at the node designated D of the latch 34C). The data latch 34C would store a state according to the voltage level on PBL. In this operation, the signal BIASR is held at about 1.5 v. Therefore, the data of the selected memory cell is transferred and latched in the data latch 34C after this read operation. Data latched in 34C could be clocked out using any state-of-the-art SRAM sense amplifier 48SA as depicted symbolically in FIG. 3C. (The data (DLU) and data bar (DLUB) signals shown in FIG. 4 are supplied to the inputs DL and DLB shown in FIG. 3C. The output of sense amplifier 48SA is further buffered with two latches connected in master-slave configuration to extend the data hold time for output buffers.

As can be seen from the foregoing, the data latch 34C is simply an SRAM but operable under two different conditions. During the operation when the data latch 34C serves to supply data to the external or to store data supplied from the external, the data is supplied on the signal lines D and DB, which become DLU and DLUB, respectively. In this condition, the node BIASR is tied to ground, and the data latch 34C functions as a conventional, symmetrical, SRAM latch. However, during the pre-fetch and sensing operation, when the data latch 34C serves to sense and to store the state of the memory cell, the memory cell is single-ended and is connected to a single bit line. In that condition BIASR is connected to 1.5 v. The latch 34C is first set to high at the D output, by the latch reset circuit 34D pulling the node DB to ground. The ratio of the conductance of P type transistor 134 in the data latch 34C to the conductance of the memory cell determines the D output of the data latch 34C.

Figure 4B:
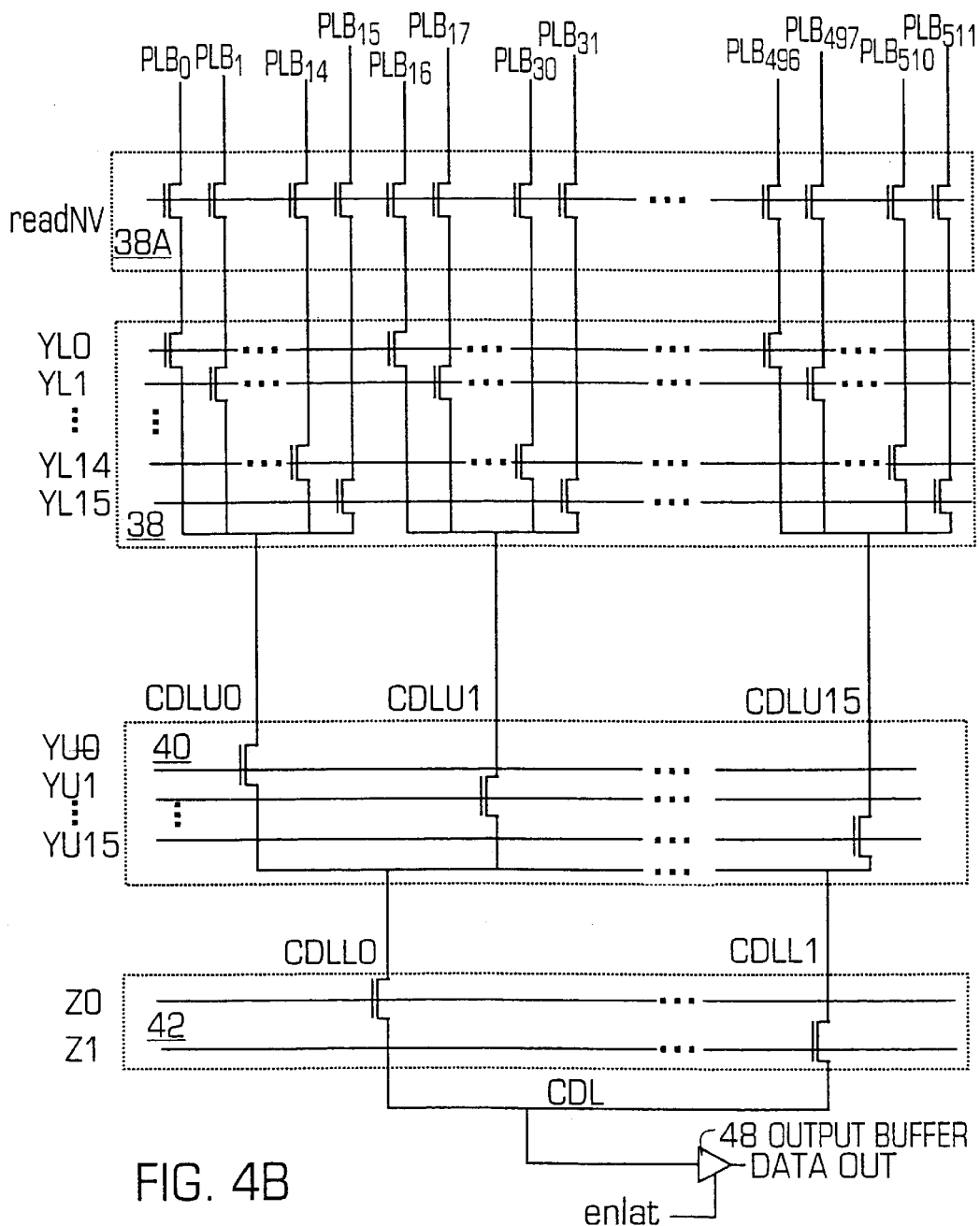
FIG. 4B is a detailed circuit diagram showing the connection between bit-lines and output buffers.

In addition to the page-mode read operation, the page buffer 34 of the present invention is able to perform random-access read operation with one additional pass-gate transistor 38A. Together with the second column decoder 38, transistor 38A connects PBL to data line CDLU and then as shown in FIG. 4B eventually to CDLLx, and then to CDL. FIG. 4B is a schematic circuit diagram showing an additional part of the second column, decoder 38/40/42. During random-access read operation, the data stored in the selected memory cell is transferred from the corresponding PBL through the second column decoder 38/40/42 to CDL without passing through the first column decoder 46 and the data latch 34. The CDL signal could be read out using any state-of-the-art non-volatile semiconductor memory sense amplifier 48NA as depicted symbolically in FIG. 3C. The output of sense amplifier 48NA is further buffered with two latches connected in master-slave configuration to extend the data hold time for output buffers.

FIG. 4A shows a detailed timing diagram for the read operation. In the period shown as "sense YLS<0>" a particular page x group is selected. When the signal YLPB<0> goes low, the selected bit line is precharged. When YLS<0> first goes high, reset of latch 34 occurs by circuit 34D being on (Rstpgb is also high), and the transistors in the first column decoder 46 are turned on. However, the signal from PBL is prevented from passing to the latch 34 by the transistors in 34B not being turned on, because BIASL is low. When BIASL initially goes high, the memory cell discharge of PBL occurs. When BIASL is high and YLS<0> is also high, the path from PBL to latch 34C is turned on. During this time Rstpgb is low preventing latch 34 from resetting. The value of the bit line PBL is then stored in the latch 34C.

The programming operation for the page buffer 34 is as follows.

Before the page-mode program operation is started, the data latch 34C is first reset by the latch reset circuit 34D. Then the input data (DLU and DLUB) from IO pads must be loaded into data latch 34C through the second column decoder 38/40/42. After the programming circuits reach the electrical steady state, the data loaded in the data latch 34C is programmed into the selected memory cell as follows. Signal pgmd of the program/sense selection circuit 34B and the selected YLS of the first column decoder 46 turn on the program path between PBL and program driving circuit 34A. Depending on the data stored in the data latch 34C, PBL will be driven to either one of the two binary voltage levels: high or low by the program driving circuit 34A. If node D=VCC (this is called program inhibit state), transistor I17 will be turned on. This will connect one of the nodes of the pass transistor I16 of circuit 34B to VCC. Turning on transistor I16 will connect PBL to VCC-VTN. The action of connecting PBL to VCC-VTN results in no programming operation. If node D is low, i.e. D=0V (this is called program state), DB will be high. This turns on transistor I18 connecting PBL to PGND which is at ground.

Figure 4C:
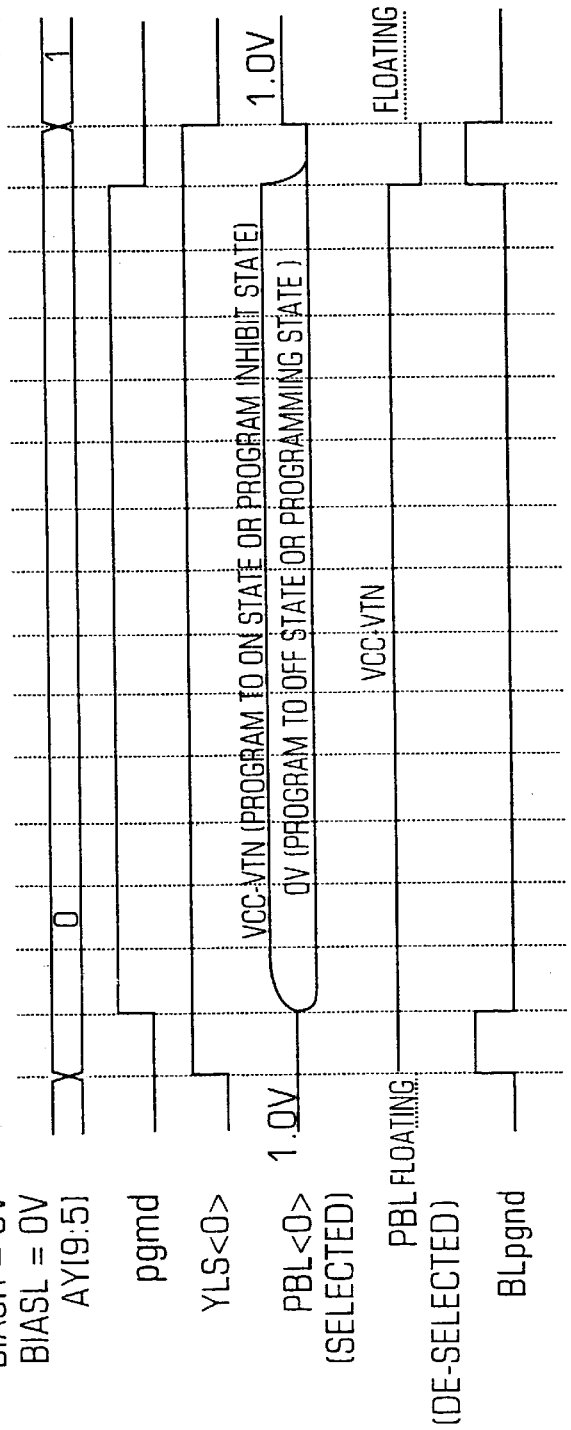
FIG. 4C is a timing diagram for page-mode program operation for the device of the present invention.
Figure 4D:
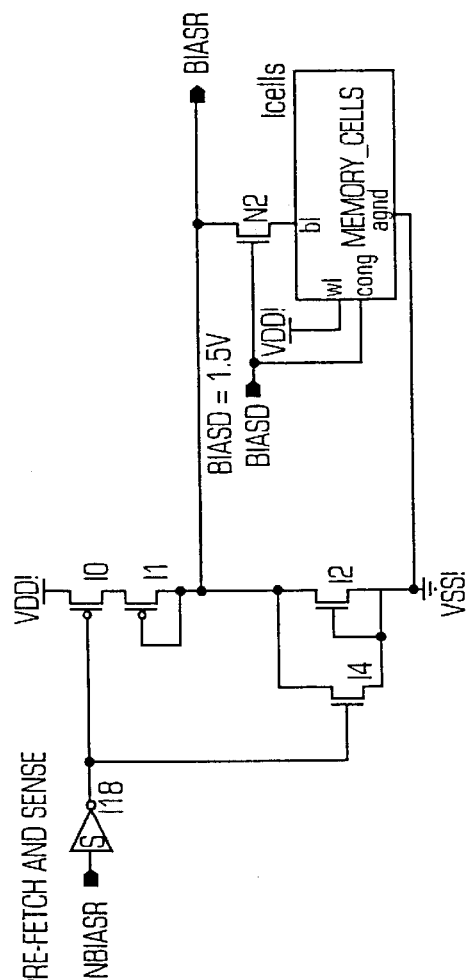
FIG. 4D is a circuit diagram showing the generation of the signal BIASR used in the circuit shown in FIG. 4.

Referring to FIG. 4C there is shown a detailed timing diagram for the aforementioned programming operation.

Figure 5:
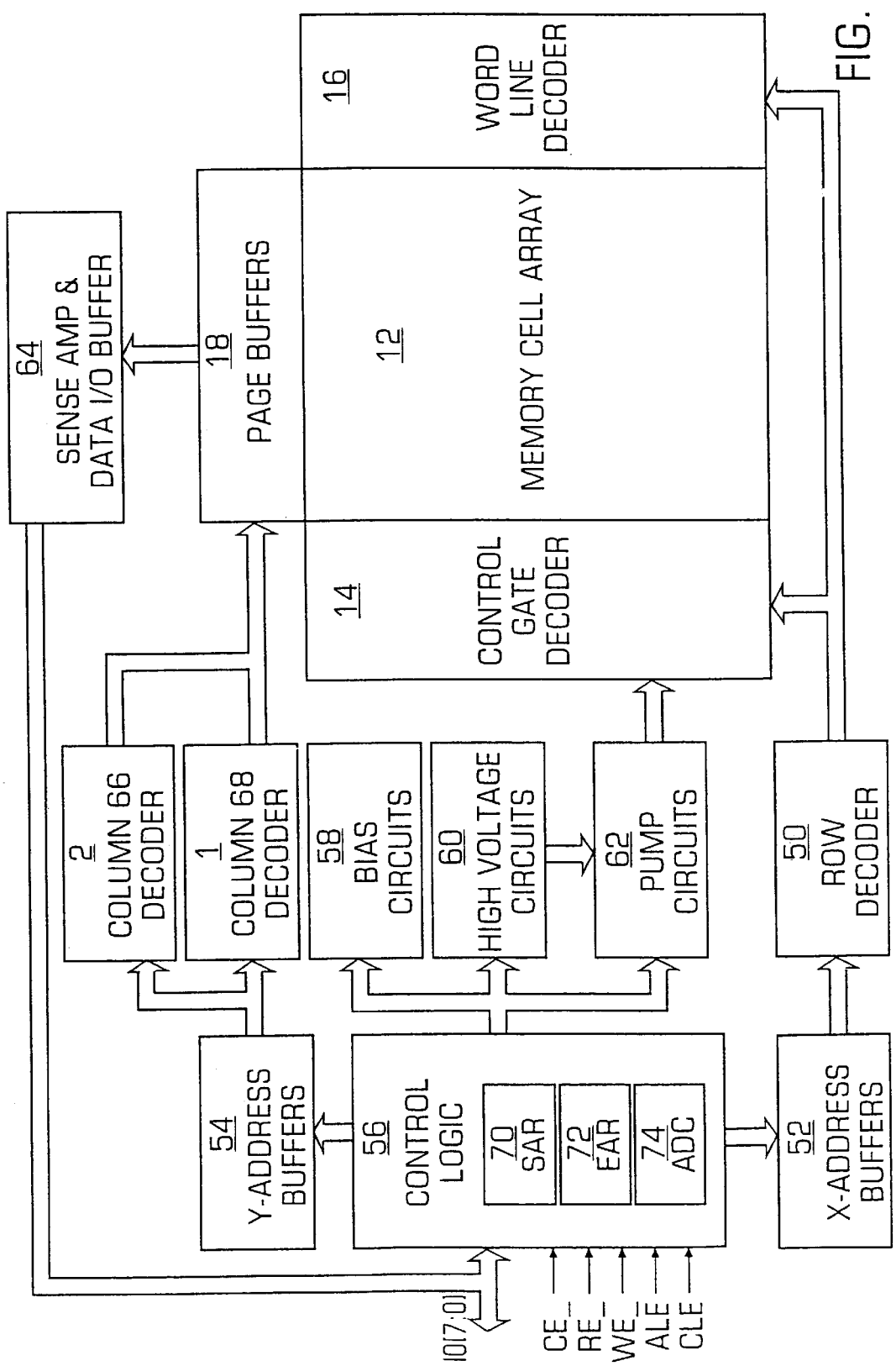
FIG. 5 is a schematic block diagram of the device of the present invention.

FIG. 5 is a schematic circuit block diagram showing various circuits for performing program and read operations according to the present invention.

Figure 6:
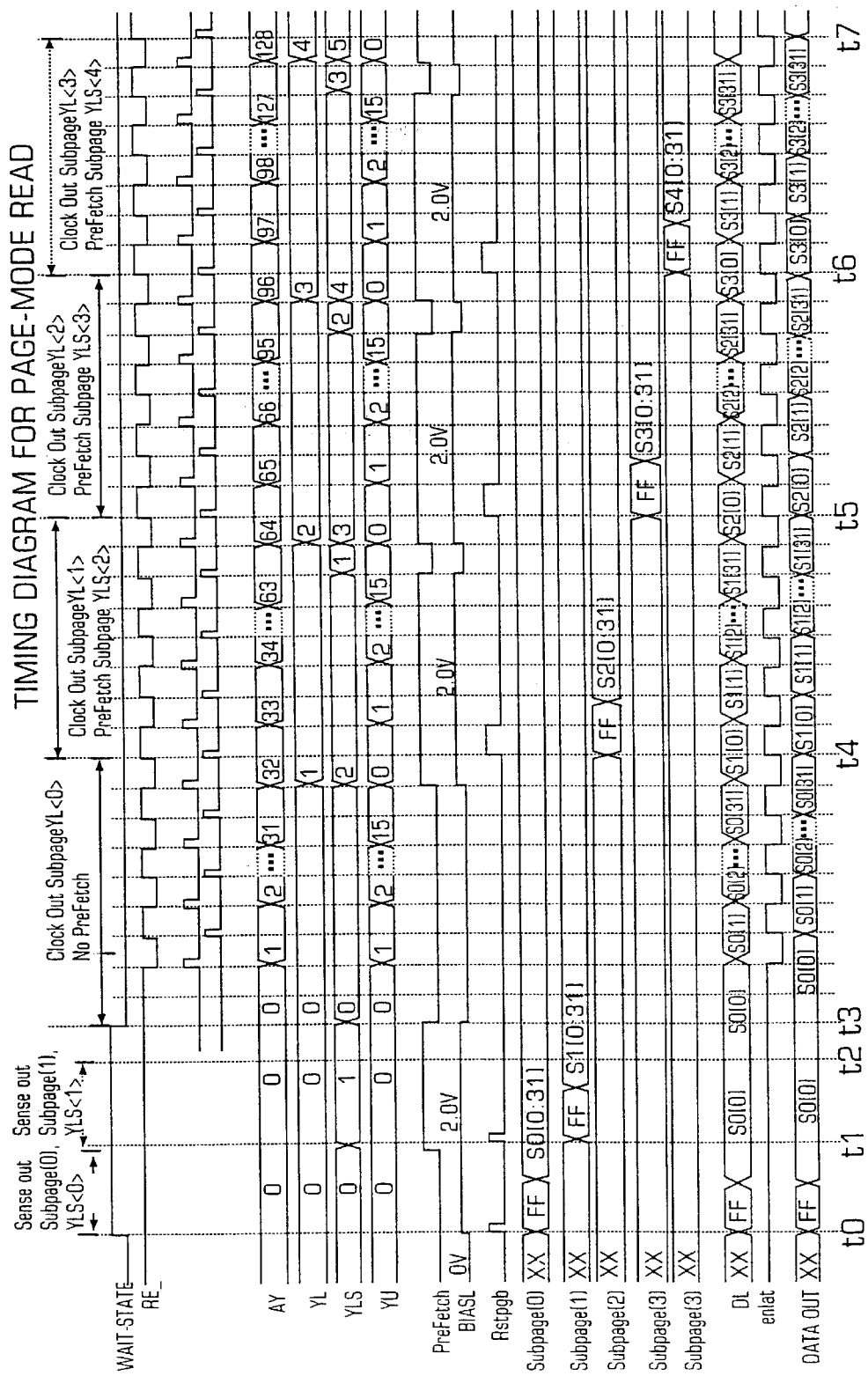
FIG. 6 is a timing chart showing the page-mode read operation for the device of the present invention.

FIG. 6 is a timing chart for performing a page-mode read operation. The page-mode read operation of the present invention starts with an initial wait-state [t0–t2] during which data of 2 sub-pages are consecutively pre-fetched into the corresponding page buffers. Those two sub-pages comprise a first sub-page being selected by external address inputs and a second sub-page logically following the first subpage. For illustration purpose, data of sub-page[0] (S0[0:31]) and data of sub-page[1] (S1[0:31]) are pre-fetched during the initial wait-state. After this initial wait-state, control signal RE_ can be toggled to sequentially clock out data S0[0:31] stored in page buffers of subpage[0] during [t3–t4]. Once the time crosses t4, the data S1[0:31] of sub-page[1] starts to be clocked out and the data of sub-page[2] (S2[0:31]) begins to be pre-fetched simultaneously during [t4–t5]. Thereafter, within any time interval t[N]–t[N+1], where N>3, data of sub-page[M] (S(M)[0:31]) are clocked out by toggling RE_ and data of sub-page[M+1] (S(M+1)[0:31]), where M=0–15 are pre-fetched, simultaneously. Since the data pre-fetching always precedes data clocking out, no wait-states are needed after time period t3. Therefore, except the initial wait-state, throughout all the rest intervals, wait-states are eliminated.

Figures 1, 7:
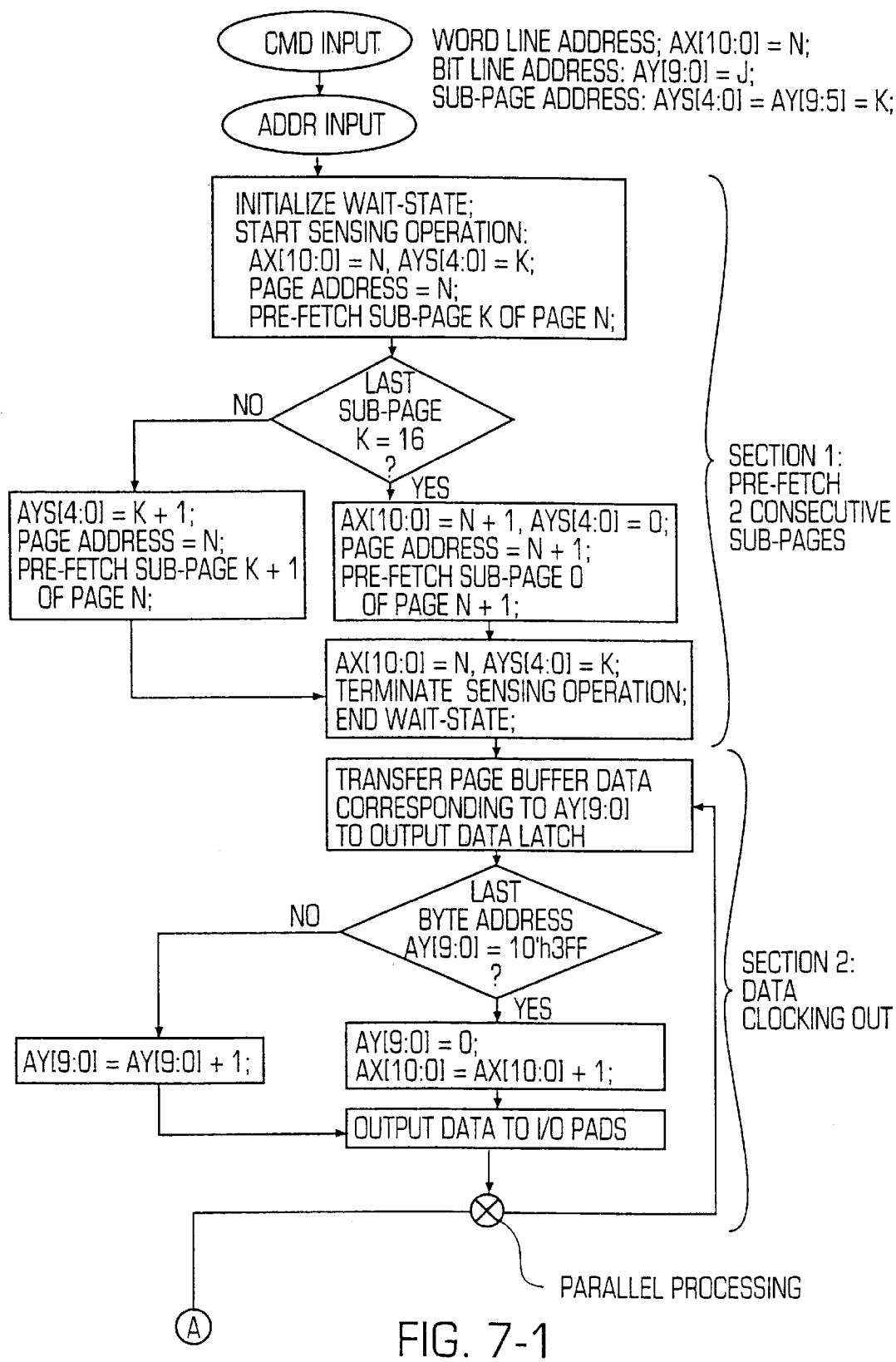
FIG. 7 is a flow chart showing the sub-page pre-fetch operation in the page mode read method of the present invention.
Figures 2, 7:
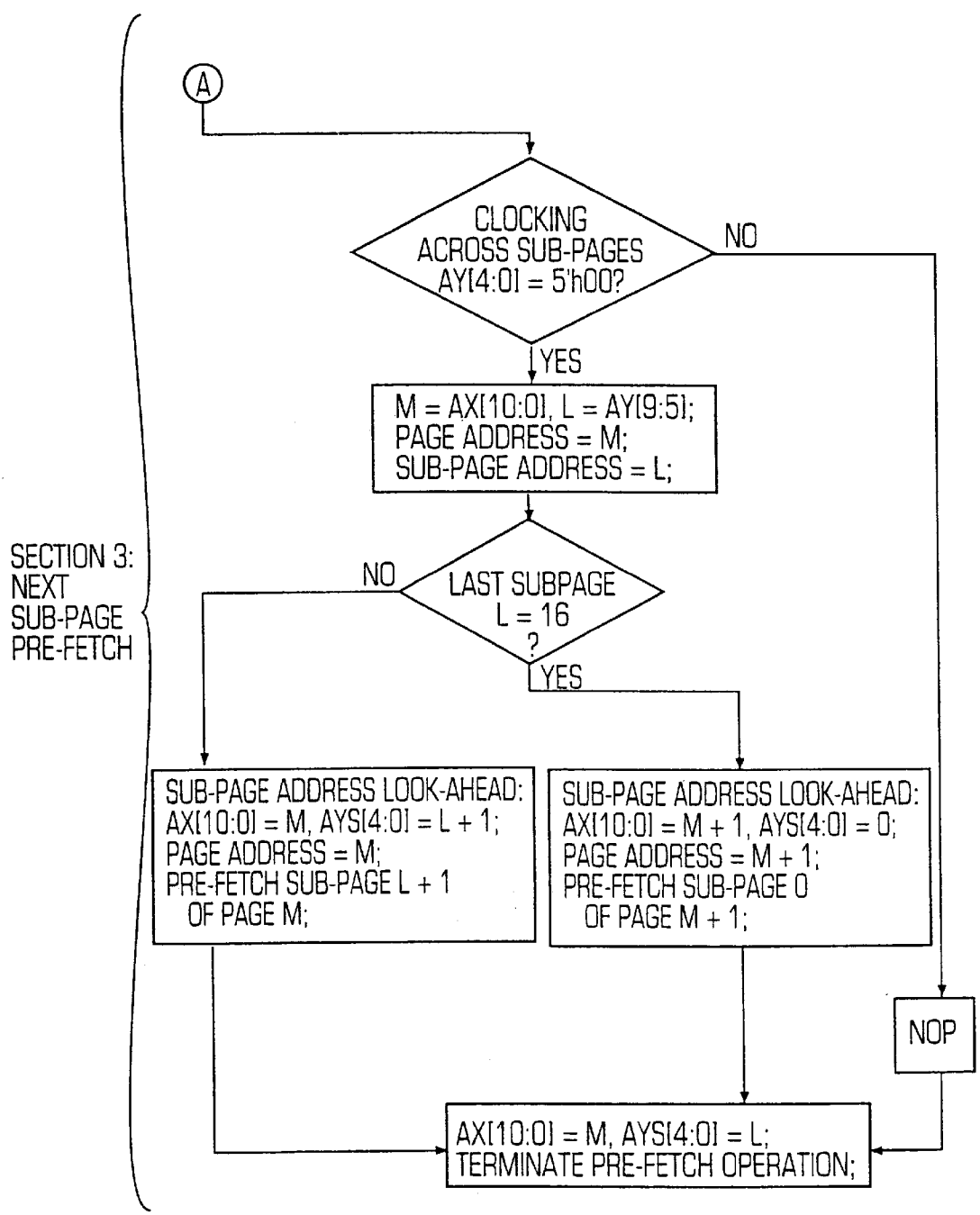

FIG. 7 is a flow chart for performing the page-mode gapless read operation of the present invention, shown in FIG. 6. This flow chart comprises 3 main sections. In section 1, 2 sub-pages are consecutively pre-fetched during an initial wait-state. The second and third sections are parallel processes. In section 2, page buffer data are clocked out. Once the address is clocked across the sub-page boundary, section 3 will be launched in parallel with the second section to pre-fetch a new sub-page.

Figures 1, 8:
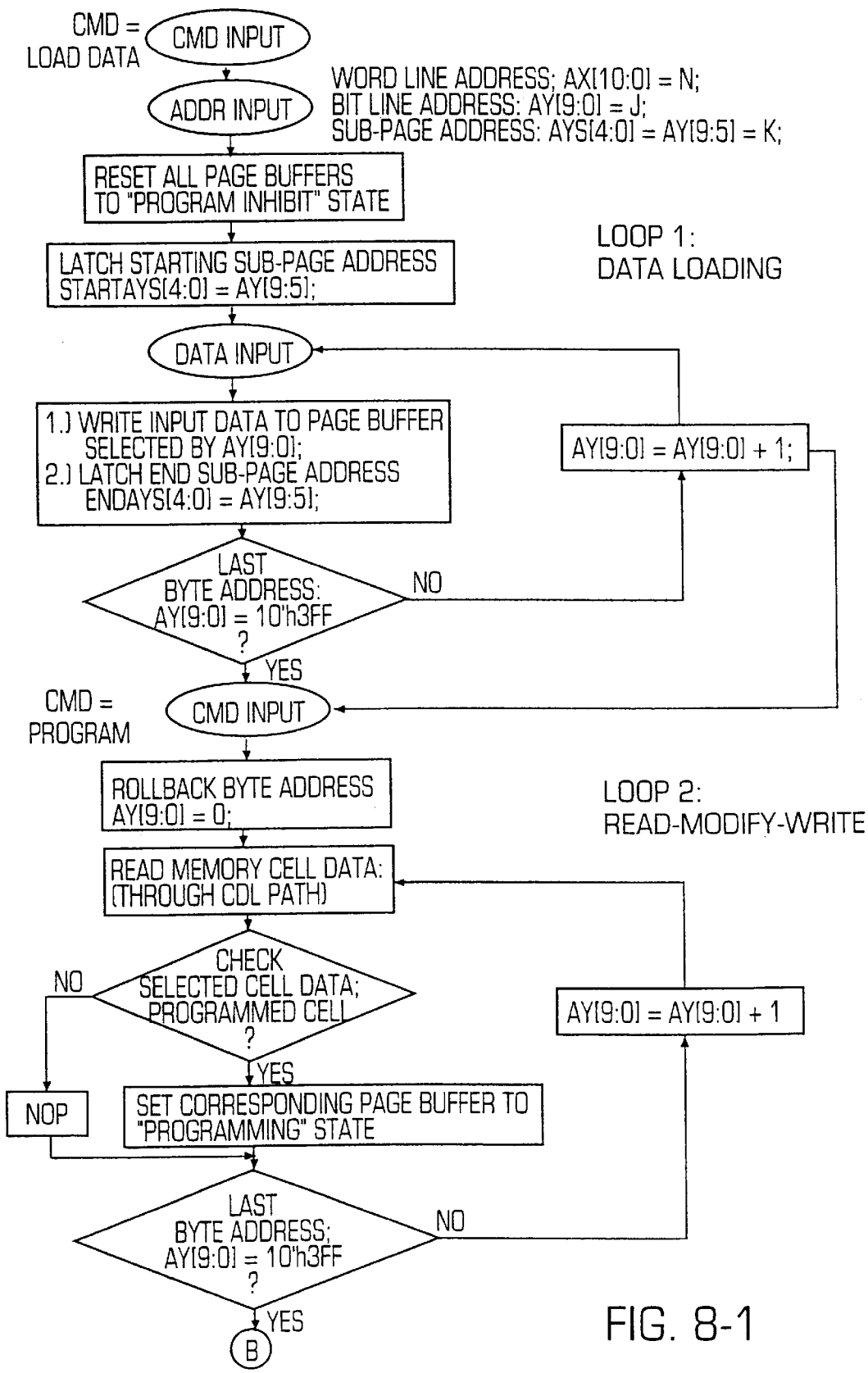
FIG. 8 is a flow chart showing the sub-page programming operation in the page mode program method of the present invention
Figures 2, 8:
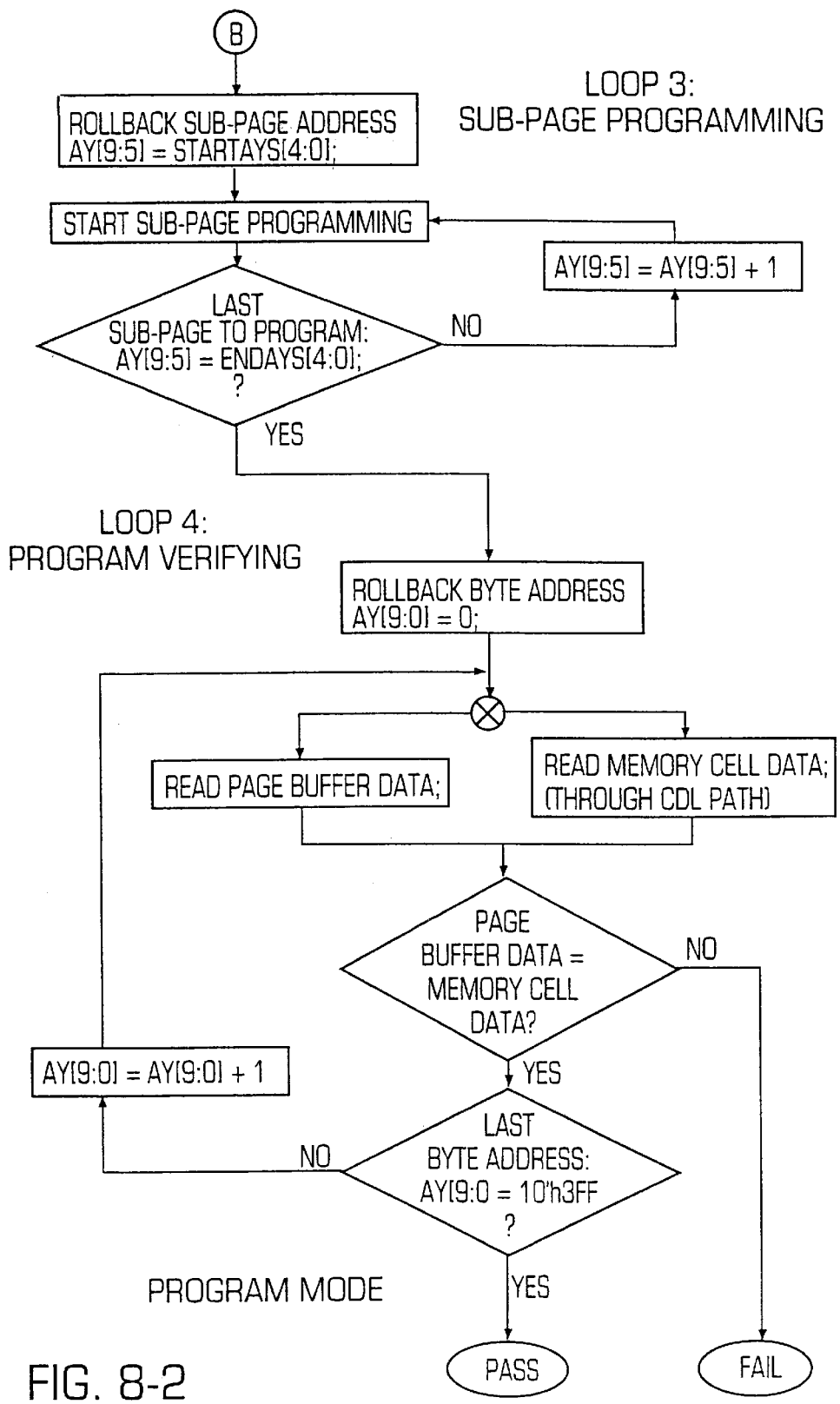

FIG. 8 is a flow chart for performing the page-mode program operation described above. This flow chart comprises 4 main loops. Before starting the program operation, all the page buffers must be reset to "program inhibit" state and a starting address must be inputted to the on-chip address counter. The starting address for programming will be latched by a first set of on-chip address registers. In loop 1, bytes of data will be loaded into page buffers sequentially. As the address counter increments, a second set of address registers store the latest address as the end address for programming. In loop 2, a read-modify-write routine is performed. In the routine, each memory cell of the selected page is read out and checked through the PBL-CDL path shown in FIG. 4B. If the memory cell is already in a programmed state, the data latch 34C of the corresponding page buffer will be set to a program state regardless of its original content.

In the NAND specification, the user can program selected pages in less than 10 program command sequences, and it is legal to load "1" in the selected sub-pages that have been programmed in the previous programming sequences. This could result in verification conflict between memory and latch data during later verification stage. (Memory cell is "0", but the latch data is "1".) One way to solve the problem is to bypass verification error when latch data is "1". However, this will not catch program disturbance error when the memory cell in the non-selected sub-page of the selected page is changed from "1" to "0" during programming. In the present invention, read-modify-write is implemented to avoid aforementioned errors during verification and to further reprogram the cells in the selected sub-page when the cells have been programmed before. All cases in read-modify-write are described as follow:

a) If the memory is in the selected sub-page of the selected page:

If the latch data is either "1" or "0" and original memory cell data is "0", read-modify-write will change the latch data to "0", and this memory will be reprogrammed. During verification, memory cell data will be compared to latch data "0".

If the new data is "0" and original memory cell data is "1", this memory will be programmed. During verification, memory cell data will be compared to latch data "0".

If the latch data is "1" and original memory cell data is "1", this memory will not be programmed. During verification, memory cell data will be compared to latch data "1".

b) If the memory is in the non-selected sub-page of the selected page:

The latch data is "1". If the original memory cell data is "0", read-modify-write will change the latch data to "0", and this memory will not be reprogrammed. During verification, memory cell data will be compared to latch data "0".

The latch data is "1". If the original memory cell data is "1", read-modify-write will not change the latch data, and this memory will not be reprogrammed. During verification, memory cell data will be compared to latch data "1".

Because of the nature of flash memory, all the memory cells can be erased only during erase operation. In the present case, erased cells hold binary data 1. During program operation, memory cells could only be programmed from 1 to 0. If the cell is originally erased to 1, it could be programmed to 0. If the cell is already programmed to 0, it could not be programmed back to 1 by program operation (only erase operation can reverse the data from 0 to 1). If the control circuits try to program any cell from 0 to 1, nothing happens to the cell. The cell should keep its original data. Therefore, in the read-modify-write procedure, the original cell data are first read out. If cells are already programmed, regardless of what the latches indicate, the latches must be flipped back to programming condition to assure that programmed cells will still be programmed cells. If cells are erased, what the latches indicate will be stored in the cells.

In FIG. 3C, circuit 48R shows a preferred embodiment to perform this read-modify-write routine. As shown in FIG. 3C, if the selected memory cell is already in a programmed state, CSAOUT will be 0V. Pass gate N0/N1 will be turned on when DlatWbk is high. Therefore, DL will be pulled down to 0V. The corresponding page buffer data will also be set to 0V (program state). In loop 3, consecutive sub-pages will be programmed successively. There are 3 register sets:

Starting address register set (SAR)
End address register set (EAR)
Address counter (ADC)

During loop 1, bytes of data are loaded into page buffers and the address from which the programming should starts is also loaded into the address counter (ADC). The SAR address register set stores this address as the starting address. As the data loading procedure stops, the address counter keep the last address on which the programming should stop. The EAR address register set stores this address as the end address. During loop3, starting address is re-loaded into address counter. Then sub-page programming starts from this address. As programming proceeds to end address, programming stops. FIG. 5 shows the SAR, EAR and ADC registers. Therefore, in this loop, only those sub-pages that are previously loaded with data in loop 1 will be programmed. In loop 4, each memory cell of the selected page will be read out through the PBL-CDL path depicted in FIG. 4B. Each data latch 34C will also be read out through the path depicted in FIG. 3B. Data of each memory cell is compared with data of its corresponding data latch 34C. If data from both the memory cell and the data latch 34 match each other, this memory is successfully programmed. Otherwise, this memory cell fails.

What is claimed:

1. An integrated circuit memory device comprising:
   a page of memory cells arranged in a plurality of sub-pages of memory cells electrically coupled to a respective plurality of word lines, and a plurality of bit lines;
   a plurality of sub-page buffers electrically coupled to said plurality of bit lines for storing data read from said memory cells coupled to said plurality of bit lines;
   an I/O data buffer;
   each sub-page comprising a plurality of non-adjacent bit lines with memory cells coupled thereto, with said bit lines of each of sub-page interleaving bit lines of another sub-page; and
   read controller circuit coupled to said plurality of sub-page buffers for initiating a read operation to read data from a first sub-page of memory cells to an associated first sub-page buffer, while simultaneously reading data from a second sub-page buffer to said I/O data buffer.

2. The device of claim 1 wherein each sub-page further comprises a plurality of non-adjacent evenly spaced apart bit lines with memory cells coupled thereto.

3. The device of claim 2 wherein each sub-page buffer is associated with a plurality of adjacent bit lines; and
   a column selection circuit for selecting a sub-page buffer to one of said plurality of adjacent bit lines.

4. The device of claim 3 wherein each sub-page buffer is associated with two bit lines.

5. The device in claim 4 wherein each sub-page buffer further comprises:

a latch;

a reset circuit coupled to said latch; and a switch for connecting said latch to said column selection circuit.

6. The device of claim 4 wherein said memory cells are non-volatile memory cells.

7. The device of claim 6 wherein said page of non-volatile memory cells is arranged in a NOR architecture.

8. A method of reading a page of memory cells arranged in a plurality of sub-pages of memory cells electrically coupled to a respective plurality of word lines and a plurality of bit lines in an integrated circuit memory device; said method comprising:

reading a first sub-page of memory cells, said first sub-page comprising memory cells couple to a first plurality of non-adjacent bit lines;

storing the data from said first sub-page of memory cells in a first sub-page buffer; and reading the data from first sub-page buffer to external to said integrated circuit memory device, while simultaneously reading a second sub-page of memory cells, said second sub-page comprising memory cells couple to a second plurality of non-adjacent bit lines, interleaved with said first plurality of non-adjacent adjacent bit lines and storing the data therefrom in a second sub-page buffer, different from said first sub-page buffer.

9. The method of claim 8 wherein said first plurality of non-adjacent bit lines are evenly spaced from one another.

10. The method of claim 9 wherein said second plurality of non-adjacent bit lines are evenly spaced from one another.

11. The method of claim 8 wherein said first sub-page buffer comprises a plurality of latches and wherein each latch is associated with a plurality bit lines.

12. The method of claim 11 wherein each latch is associated with two bit lines.

13. The method of claim 11 wherein said second sub-page buffer comprises a plurality of latches and wherein each latch is associated with a plurality of bit lines.

* * * * *